(12) United States Patent
Chottiner et al.

(10) Patent No.: US 9,476,485 B2
(45) Date of Patent: Oct. 25, 2016

(54) DIAMOND-LIKE CARBON COATING ON CHAIN GUIDES AND TENSIONING ARMS FOR INTERNAL COMBUSTION ENGINES

(71) Applicant: Ford Global Technologies, LLC, Dearborn, MI (US)

(72) Inventors: Jeffrey Eliot Chottiner, Farmington Hills, MI (US); Rick L. Williams, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 284 days.

(21) Appl. No.: 14/211,402

(22) Filed: Mar. 14, 2014

(65) Prior Publication Data
US 2015/0260263 A1    Sep. 17, 2015

(51) Int. Cl.
| | |
|---|---|
| *F16H 7/18* | (2006.01) |
| *C23C 16/27* | (2006.01) |
| *C23C 16/50* | (2006.01) |
| *C23C 28/04* | (2006.01) |
| *C23C 14/48* | (2006.01) |
| *C23C 14/02* | (2006.01) |
| *C23C 16/02* | (2006.01) |
| *C23C 14/20* | (2006.01) |
| *F16H 7/08* | (2006.01) |
| *C23C 28/00* | (2006.01) |
| *C23C 16/26* | (2006.01) |
| *C23C 16/515* | (2006.01) |

(52) U.S. Cl.
CPC ............. *F16H 7/08* (2013.01); *C23C 16/0245* (2013.01); *C23C 16/0272* (2013.01); *C23C 16/26* (2013.01); *C23C 16/515* (2013.01); *C23C 28/322* (2013.01); *C23C 28/323* (2013.01); *F16H 7/18* (2013.01); *F16H 2007/185* (2013.01)

(58) Field of Classification Search
CPC ...... F16H 2007/185; F16H 7/08; F16H 7/18; C23C 14/022; C23C 14/20; C23C 14/48; C23C 16/27; C23C 16/50; C23C 28/322; C23C 28/325
USPC .......................................................... 474/111
See application file for complete search history.

(56) References Cited

U.S. PATENT DOCUMENTS

| | | | | |
|---|---|---|---|---|
| 5,458,927 A * | 10/1995 | Malaczynski | ........... | C23C 16/26 427/255.7 |
| 6,036,613 A * | 3/2000 | Diehm | ...................... | F01L 1/02 474/111 |
| 6,348,237 B2 * | 2/2002 | Kohler | ...................... | C08J 3/201 427/249.15 |
| 2003/0181273 A1 * | 9/2003 | Nakagawa | ............ | F16H 7/0848 474/101 |
| 2005/0277506 A1 * | 12/2005 | Konno | ...................... | F16H 7/18 474/111 |
| 2012/0164352 A1 * | 6/2012 | Hotta | ........................ | C08J 3/201 427/569 |
| 2014/0057749 A1 * | 2/2014 | Konno | ...................... | F16H 7/18 474/111 |
| 2014/0335985 A1 * | 11/2014 | Wang | ........................ | F16H 7/18 474/111 |

* cited by examiner

*Primary Examiner* — William E Dondero
*Assistant Examiner* — Robert T Reese
(74) *Attorney, Agent, or Firm* — Thomas T. Moga

(57) ABSTRACT

A nylon chain tensioning arm and nylon chain guide having diamond-like carbon coatings are provided. The diamond-like carbon coating is formed on the substrate by methods including physical vapor deposition, for example, by sputtering or chemical vapor deposition of coating systems composed of various combinations of amorphous carbon. A preferred method for applying the diamond-like carbon coating to the nylon substrate is a hybrid process of plasma-based ion implantation and deposition. The chain tensioning arm or guide may be formed from any number of plastics appropriate to the purpose, although a synthetic polymer, such as the aliphatic polyamide nylon, is the preferred material. The substrate may be a conventional nylon or may be a composite reinforced with glass or carbon fibers. The diamond-like carbon coating may be applied to the nylon substrate by vapor deposition, either directly to the chain-contacting surface or upon a primed surface formed on the substrate prior to deposition.

18 Claims, 3 Drawing Sheets

DIAMOND-LIKE CARBON COATING ON CHAIN GUIDES AND TENSIONING ARMS FOR INTERNAL COMBUSTION ENGINES

TECHNICAL FIELD

The disclosed inventive concept relates generally to chain guides and tensioning arms used in conjunction with timing chains in internal combustion engines. More particularly, the disclosed inventive concept relates to chain guides and tensioning arms having wear-resistant, diamond-like carbon coatings.

BACKGROUND OF THE INVENTION

The modern internal combustion engine incorporates chain guides and chain tensioners in relation to valvetrain or balanceshaft chain drive systems. Such chains replace, for example, gears and timing belts that connect the crankshaft with the camshafts. While providing superior performance and durability when compared with earlier approaches to linking the crankshaft and the camshafts, timing chains must operate under a predetermined amount of tension to minimize wear and to reduce both vibration and noise.

To answer this need, a timing chain is placed under tension over its entire travel by one or more chain tensioners. Chain tensioning arms commonly provided in internal combustion engines respond to longitudinal stretching of the chain and control longitudinal and transverse vibrations of the chain, which may be caused by excitations arising from the camshaft, the crankshaft and associated components. Chain guides are used in conjunction with the chain tensioning arms to maintain the proper course of chain travel.

According to known technology, chain tensioning arms and chain guides are composed of any of a variety of metals, typically cast metals. While proving generally satisfactory, because of metal-on-metal friction today's metal chain tensioning arms and guides are sometimes known to wear prematurely and to generate an undesirable level of engine noise. In fact, chain drive systems have relatively higher friction than belt or gear drive systems.

In response to this problem, various plastics have been proposed for use as materials for chain tensioning arms and guides. However, while solving the problem of engine noise caused by known metal tensioners and guides, the plastic versions of these components still suffer from poor wear characteristics.

As in so many areas of vehicle technology there is always room for improvements related to the design of timing chain tensioning arms and guides as used in the internal combustion engine.

SUMMARY OF THE INVENTION

The disclosed invention overcomes the problems of known timing chain tensioning arms and guides by providing such components with a friction-reducing, wear-resistant surface in a practical, efficient and cost-effective manner. According to the disclosed inventive concept, the chain-contacting surfaces of the chain tensioning arms and guides are coated with a friction-reducing material.

According to the disclosed inventive concept, a diamond-like carbon coating is formed on the chain-contacting surface of the plastic chain tensioning arm and chain guide. The diamond-like carbon coating or amorphous hydrogenated carbon film provides a hard, wear-resistant film that firmly adheres to the plastic substrate. The coating provides highly desirable surface properties that include wear resistance, low friction, lubricant compatibility, and other advantageous chemical properties.

The diamond-like carbon coating is formed on the substrate by methods including physical vapor deposition (PVD), for example, by sputtering or chemical vapor deposition (CVD) of coating systems composed of various combinations of amorphous hydrogenated carbon, silicon-doped amorphous hydrogenated carbon, boron-, nitrogen-, boron nitride-, or metal- and doped amorphous hydrogenated carbon, silicon, silicon carbide, silicon nitride, boron nitride, and mixtures thereof. The thickness of the diamond-like carbon coating layer may be varied across the chain-contacting surface of the substrate so as to achieve the most effective results.

A preferred method for applying the diamond-like carbon coating to the nylon substrate is a hybrid process of plasma-based ion implantation and deposition (PIIBD). This process allows deposition of the diamond-like carbon coating on the substrate at a relatively low temperature, thus avoiding the risk of deformation of the substrate that might result from methods requiring higher heat for coating applications.

The diamond-like carbon coating may be applied to the nylon substrate by vapor deposition, either directly to the chain-contacting surface or upon a primed surface formed on the substrate prior to deposition.

The chain tensioning arm or guide may be formed from any number of plastics appropriate to the purpose, although a synthetic polymer, such as the aliphatic polyamide nylon, is the preferred material. The substrate may be a conventional nylon or may be a composite reinforced with glass or carbon fibers.

The above advantages and other advantages and features will be readily apparent from the following detailed description of the preferred embodiments when taken in connection with the accompanying drawings.

BRIEF DESCRIPTION OF THE DRAWINGS

For a more complete understanding of this invention, reference should now be made to the embodiments illustrated in greater detail in the accompanying drawings and described below by way of examples of the invention wherein.

DETAILED DESCRIPTION OF THE PREFERRED EMBODIMENT

Figure 1:
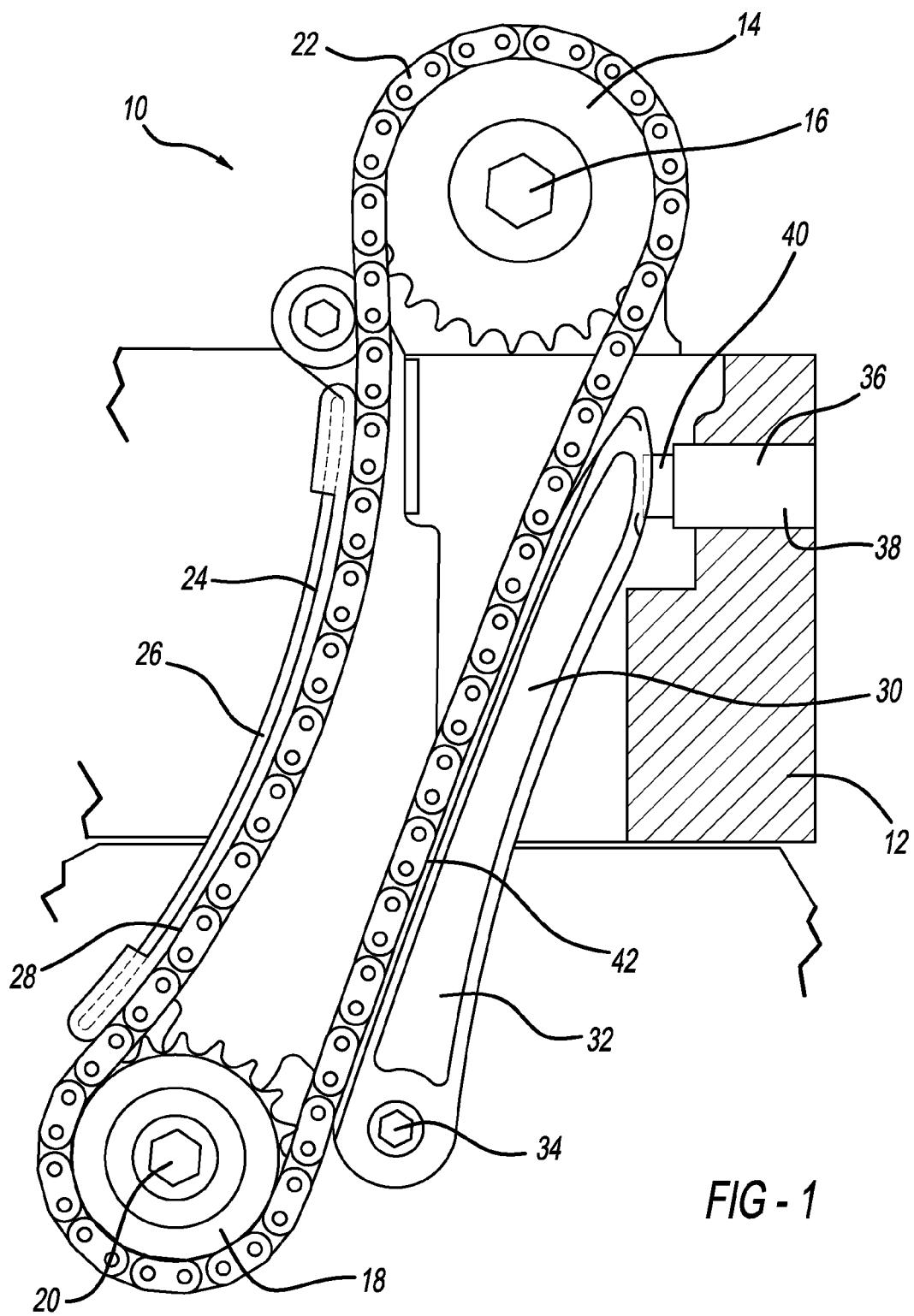
FIG. 1 is a schematic illustration of a part of an internal combustion engine with a continuously running chain led over the chain tensioning arm and chain guide having a diamond-like carbon coating according to the disclosed inventive concept.

In the following figures, the same reference numerals will be used to refer to the same components. In the following description, various operating parameters and components are described for different constructed embodiments. These specific parameters and components are included as examples and are not meant to be limiting.

In general, the disclosed inventive concept provides a chain tensioning arm and a chain guide having a diamond like surface coating. FIG. 1 illustrates a schematic partial section of an internal combustion engine, generally illustrated as 10. The engine 10 is intended as being illustrative and not limiting and it is thus to be understood that the disclosed inventive concept can have a wide variety of applications to virtually any chain drive system having either or both a chain tensioning arm and a chain guide.

As shown in FIG. 1, the engine 10 includes an engine block 12, of which only a portion is illustrated. The engine 10 further includes a camshaft sprocket 14 fitted to a camshaft 16. While only one camshaft 16 and associated camshaft sprocket 14 are illustrated, it is to be understood that a similar arrangement having two camshafts may be suitable as well for the disclosed inventive concept. The engine 10 further includes a drive shaft sprocket 18 fitted to a drive shaft 20.

A timing chain 22 is trained over the camshaft sprocket 14 and the drive shaft sprocket 18. A timing chain guide 24 having a chain guide body 26 is attached to the engine block 12 and provides a guide for the timing chain 22. The timing chain guide 24 is formed from nylon or a similar aliphatic polyamide. The chain guide body 26 includes a timing chain contact surface 28 having a diamond-like carbon coating formed thereon.

A chain tensioning arm 30 having a chain tensioning arm body 32 is pivotably attached to the engine block 12 by a shoulder bolt 34. The chain tensioning arm 30 is formed from nylon or a similar aliphatic polyamide. The chain tensioning arm 30 applies a constant pressure to the timing chain 22 to thereby maintain appropriate tension during engine operation. A chain tensioner 36 applies an appropriate tension to the end of the chain tensioning arm 30 opposite the end of the chain tensioning arm 30 attached to the engine block 12 by the shoulder bolt 34. The chain tensioner 36 may be of any type of tensioner. In the illustrated example, the chain tensioner 36 includes a body 38 having a reciprocating piston 40 which moves back and forth within the body 38 as required to maintain proper tension on the timing chain 22.

The chain tensioning arm 30 includes a timing chain contact surface 42. As is the case with the timing chain contact surface 28 of the chain guide body 26, the timing chain contact surface 42 of the chain tensioning arm 30 has a diamond-like carbon coating formed thereon.

Figure 2:
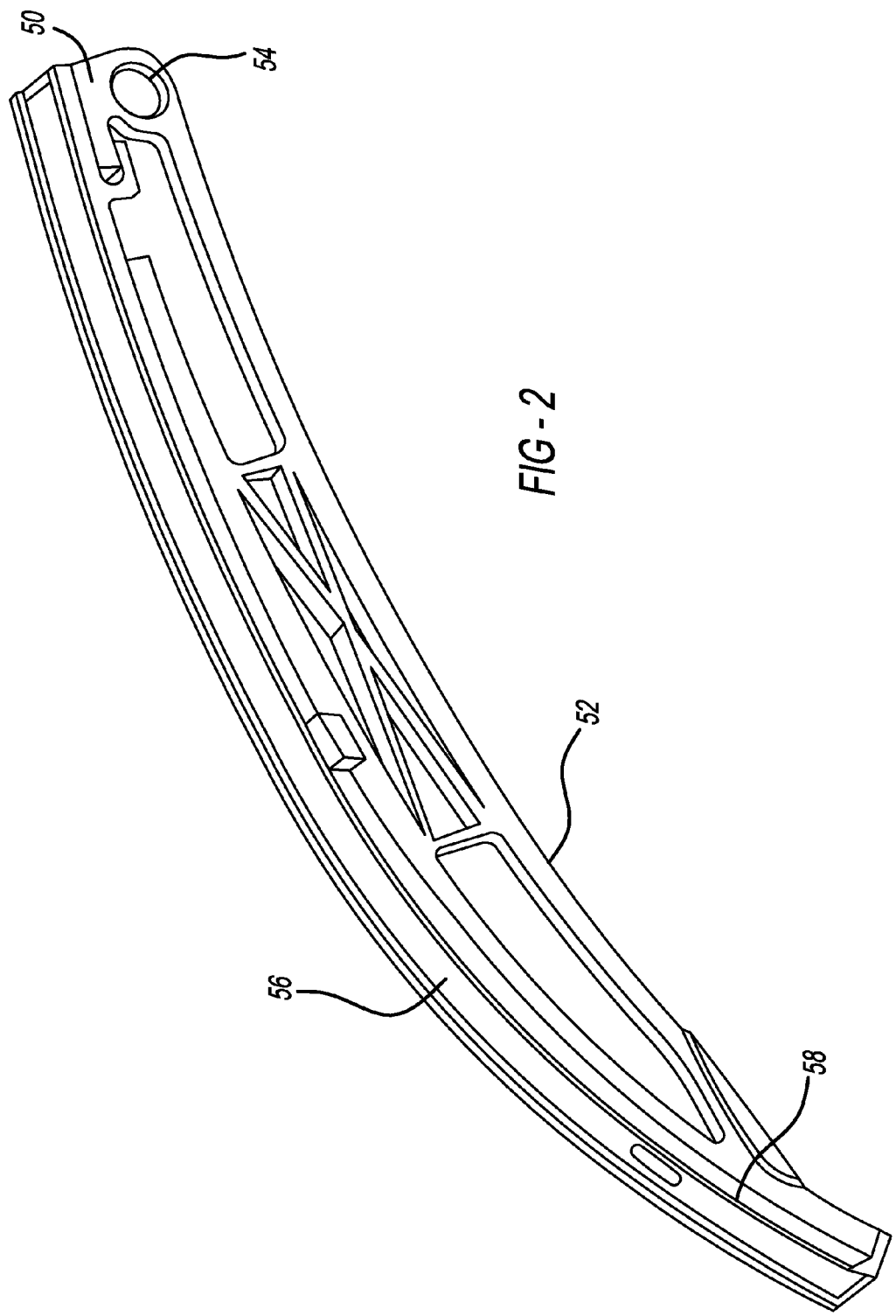
FIG. 2 illustrates a perspective view of a tensioning arm having a diamond-like carbon coating according to the disclosed inventive concept.
Figure 3:
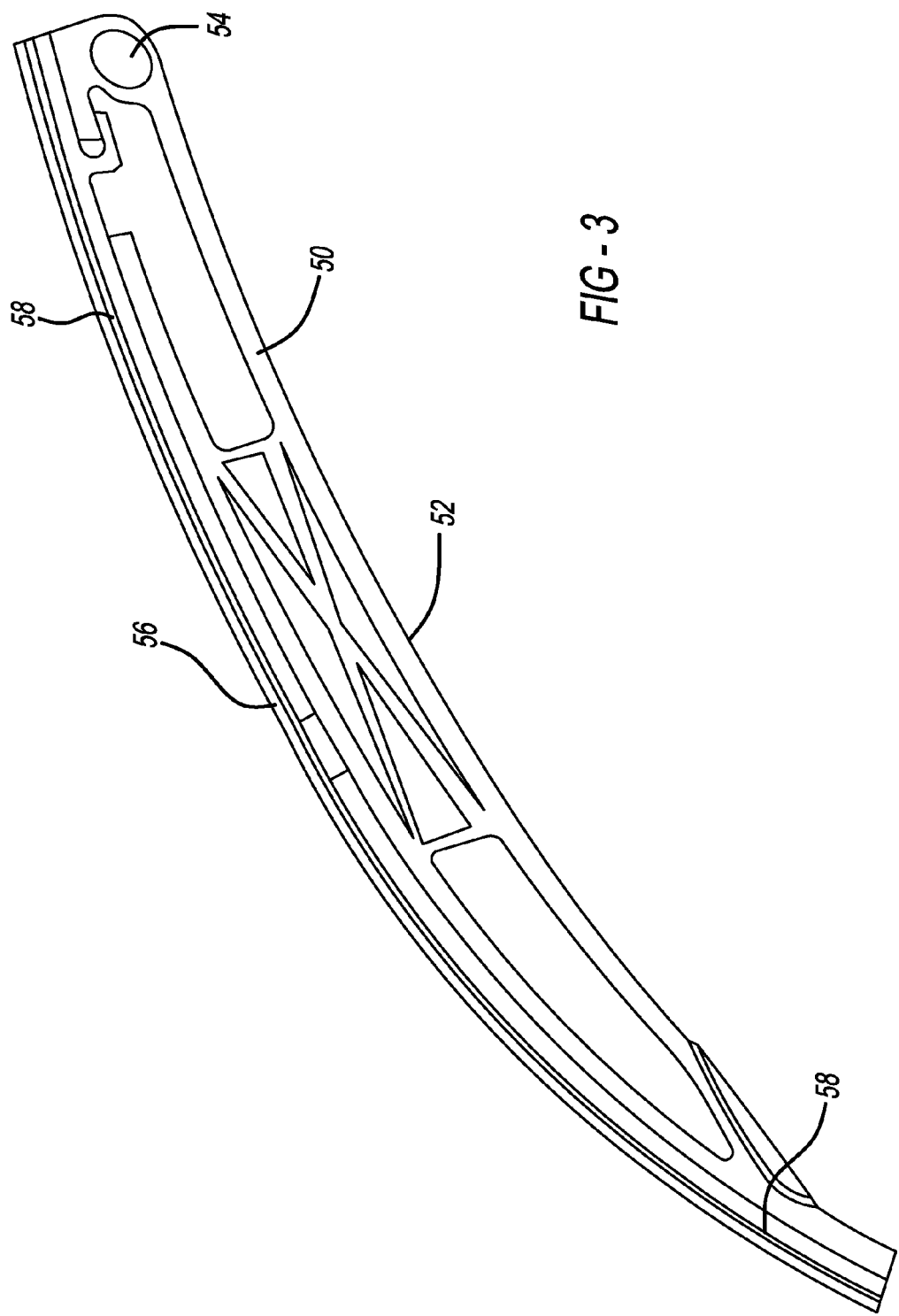
FIG. 3 illustrates a side view of the tensioning arm shown in FIG. 2.

The chain tensioning arm 30 illustrated in FIG. 1 and discussed above is one example of a tensioning arm that would be suitable for application of the diamond-like carbon coating of the disclosed inventive concept. Tensioning arms having different configurations may be suitable as well. As a non-limiting example of alternative configurations of chain tensioning arms having a diamond-like carbon coating, FIGS. 2 and 3 illustrate a chain tensioning arm 50 that is also suggestive and non-limiting. The chain tensioning arm 50 includes a chain tensioning arm body 52 and a pivot point 54 through which a shoulder bolt (not shown) passes for attachment to the engine block 12.

The chain tensioning arm 50 is formed from nylon or a similar aliphatic polyamide and includes a timing chain contact surface 56 having a diamond-like carbon coating formed thereon. An example of a suitable material is Noryl GTX6601 (GE Plastics Co.) that is a polymer alloy consisting of nylon 66 and poly(phenylene ether). This material possesses the desirable characteristics for chain contact. These characteristics include dimensional stability, good heat resistance and good chemical resistance.

The nylon or other aliphatic polyamide material forming the timing chain guide 24, the chain tensioning arm 30 and the chain tensioning arm 50 may be reinforced with glass fibers or with carbon fibers. In addition, the nylon may include a dispersed carbide-forming material such as titanium or iron to enhance formation of the diamond-like carbon coating Diamond-like carbon coatings have particular application to the chain contact surfaces of the chain guide 24 and the chain tensioning arms 30 and 50 because such coatings provide both a low coefficient of friction and a high degree of micro-hardness resulting in exceptional hardness. Having these tribological properties, diamond-like carbon coatings provide a desirable surface coating for the chain guide 24 and the chain tensioning arms 30 and 50.

A diamond-like carbon coating is created when ionized and decomposed carbon (or a hydrocarbon species) is deposited on the surface of the nylon substrate of the chain guide 24 and the chain tensioning arms 30 and 50. The diamond-like carbon coating is formed on the substrate by any of several methods including physical vapor deposition (PVD), for example, by sputtering or chemical vapor deposition (CVD) of coating systems composed of various combinations of amorphous hydrogenated carbon, silicon-doped amorphous hydrogenated carbon, boron-, nitrogen-, boron nitride-, or metal- and doped amorphous hydrogenated carbon, silicon, silicon carbide, silicon nitride, boron nitride, and mixtures thereof. The thickness of the diamond-like carbon coating layer formed on the chain contact surface of the chain guide 24 and the chain tensioning arms 30 and 50 may be varied across the chain-contacting surface of the substrate so as to achieve the most effective results.

A preferred method for applying the diamond-like carbon coating to the chain contact surface of the chain guide 24 and the chain tensioning arms 30 and 50 is a hybrid process of plasma-based ion implantation and deposition (PIIBD). This process allows deposition of the diamond-like carbon coating on the substrate at a relatively low temperature (<200° C.), thus avoiding the risk of deformation of the substrate that might result from methods requiring higher heat for coating application.

The PBIID method of coating comprises four steps. The first step is sputter-cleaning the substrate using plasma of mixed gases, preferably argon and methane. The second step subjects the substrate to silicon ion implantation through a flow of a precursor gas such as hexamethyl disiloxane under a pulse voltage of between about −2 kV and about −8 kV. The silicon implantation forms an intermediate coat 58 (shown in FIGS. 2 and 3) to enhance adhesion of the diamond-like carbon coating on the chain contact surface. The intermediate coat 58 increases interface strength between the chain contact surface of the chain guide 24 and the chain tensioning arms 30 and 50 and the diamond-like carbon coating.

The third step according to the PBIID method is to form the diamond-like carbon coating material using acetylene plasma, also under a pulse voltage of between about −2 kV and about −8 kV. The last step for applying the coating is to deposit the diamond-like carbon coating film through a gas mixture of acetylene and toluene.

Regardless of the composition of the substrate or the method of applying the diamond-like carbon coating, the resulting chain guide 24 and the chain tensioning arms 30 and 50 demonstrate low friction and high durability, thus overcoming the noise, vibration and wear challenges facing the prior art chain contact components in the internal combustion engine. The friction coefficient against steel generally ranges from 0.05-0.20. The hardness of the diamond-like carbon coating can be adjusted based on method of application and can range anywhere from 500 HV to 9000 HV.

However, one skilled in the art will readily recognize from such discussion, and from the accompanying drawings and claims that various changes, modifications and variations can be made therein without departing from the true spirit and fair scope of the invention as defined by the following claims.

What is claimed is:

1. A component for sliding contact with a timing chain in an internal combustion engine, the component comprising:
    a body having a sliding chain contact area, said body being composed of a polymerized material, said polymerized material being an aliphatic polyamide;
    an amorphous carbon coating formed on said contact area; and
    an intermediate coat between said contact area and said coating.

2. The component for sliding contact with a timing chain according to claim 1, wherein said component is selected from the group consisting of a timing chain guide and a timing chain tensioning arm.

3. The component for sliding contact with a timing chain in an internal combustion engine according to claim 1, the component body including one or more supplemental components selected from the group consisting of glass fiber, carbon fiber, titanium and iron.

4. The component for sliding contact with a timing chain according to claim 3, wherein said aliphatic polyamide is nylon.

5. The component for sliding contact with a timing chain according to claim 1, wherein said amorphous carbon coating is selected from the group consisting of one or more of amorphous hydrogenated carbon, silicon-doped amorphous hydrogenated carbon, boron-, nitrogen-, boron nitride-, or metal- and doped amorphous hydrogenated carbon, silicon, silicon carbide, silicon nitride, boron nitride, and mixtures thereof.

6. The component for sliding contact with a timing chain according to claim 1, wherein said intermediate coat is silicon.

7. A component for sliding contact with a timing chain in an internal combustion engine, the component comprising:
    a body having a sliding chain contact area, said body being composed of a polymerized material;
    an amorphous carbon coating formed on said contact area; and
    an intermediate coat between said contact area and said coating.

8. The component for sliding contact with a timing chain according to claim 7, wherein said component is selected from the group consisting of a timing chain guide and a timing chain tensioning arm.

9. The component for sliding contact with a timing chain according to claim 7, wherein said polymerized material is an aliphatic polyamide.

10. The component for sliding contact with a timing chain according to claim 9, wherein said aliphatic polyamide is nylon.

11. The component for sliding contact with a timing chain according to claim 7, wherein said amorphous carbon coating is selected from the group consisting of one or more of amorphous hydrogenated carbon, silicon-doped amorphous hydrogenated carbon, boron-, nitrogen-, boron nitride-, or metal- and doped amorphous hydrogenated carbon, silicon, silicon carbide, silicon nitride, boron nitride, and mixtures thereof.

12. The component for sliding contact with a timing chain according to claim 7, wherein said intermediate coat is silicon.

13. The component for sliding contact with a timing chain according to claim 7, wherein said body includes at least one additional material selected from the group consisting of glass fiber, carbon fiber, titanium and iron.

14. A method for coating a component having sliding contact with a timing chain in an internal combustion engine, the method comprising the steps of:
    forming a component from a polymerized material, said component having a chain contact surface;
    cleaning said component;
    forming a diamond-like amorphous carbon coating using acetylene plasma under a pulse voltage of between about −2 kV and about −8 kV; and
    applying said diamond-like carbon coating film to said chain contact surface of said component through a gas mixture.

15. The method for coating a component of claim 14, wherein said diamond-like amorphous carbon coating is selected from the group consisting of one or more of amorphous hydrogenated carbon, silicon-doped amorphous hydrogenated carbon, boron-, nitrogen-, boron nitride-, or metal- and doped amorphous hydrogenated carbon, silicon, silicon carbide, silicon nitride, boron nitride, and mixtures thereof.

16. The method for coating a component of claim 14, wherein said component is formed from an aliphatic polyamide and includes one or more components from the group consisting of glass fibers, carbon fibers, titanium and iron.

17. The method for coating a component of claim 14, wherein said cleaning step includes sputter-cleaning the substrate using plasma of mixed gases argon and methane and including the step of forming an intermediate coat by subjecting substrate to silicon ion implantation by flowing hexamethyl disiloxane as a precursor gas after said cleaning step and before said step of forming a diamond-like amorphous carbon coating.

18. The method for coating a component of claim 14 wherein said gas mixture is a mixture of acetylene and toluene.

* * * * *